United States Patent [19]

Zhang et al.

[11] Patent Number: 5,320,984
[45] Date of Patent: Jun. 14, 1994

[54] METHOD FOR FORMING A SEMICONDUCTOR FILM BY SPUTTER DEPOSITION IN A HYDROGEN ATMOSPHERE

[75] Inventors: Hongyong Zhang, Kanagawa; Shunpei Yamazaki, Tokyo; Takashi Inushima, Kanagawa, all of Japan

[73] Assignee: Semiconductor Energy Laboratory Co., Ltd., Kanagawa, Japan

[21] Appl. No.: 810,422

[22] Filed: Dec. 20, 1991

[30] Foreign Application Priority Data

Dec. 21, 1990 [JP] Japan ................................. 2-418137
Dec. 21, 1990 [JP] Japan ................................. 2-418295

[51] Int. Cl.$^5$ ..................... H01L 21/00; H01L 21/02; H01L 21/469
[52] U.S. Cl. ................................. 437/233; 437/234; 204/192.25
[58] Field of Search ............................. 427/233, 234; 204/192.25

[56] References Cited

U.S. PATENT DOCUMENTS 3,616,401 10/1971 Cunningham et al. ........ 204/192.15
3,844,924 10/1974 Cunningham et al. ........ 204/298.26
4,716,340 12/1987 Lee et al. ........................ 204/298.18

FOREIGN PATENT DOCUMENTS 0095318 7/1980 Japan .

Primary Examiner—Brian E. Hearn
Assistant Examiner—B. Everhart
Attorney, Agent, or Firm—Sixbey, Friedman, Leedom & Ferguson

[57] ABSTRACT

There is disclosed a method for forming a semiconductor film having a high electrical conductivity on a substrate at a low temperature below 200° C. with high productivity by sputtering. For example, the sputtering process is carried out within an inert atmosphere consisting of an inert gas such as argon and hydrogen. The substrate is electrically insulated (floating) from the surroundings. The distance between the substrate and a target is set to a large value. Preferably, the ratio of the partial pressure of the hydrogen to the total pressure is 30 % or more. The target consists of a semiconductor doped with an impurity that imparts one conductivity type to the semiconductor, in the case where a semiconductor film containing an impurity that imparts the conductivity type to the semiconductor film is formed on the substrate. This impurity is for example a group III or V element.

15 Claims, 8 Drawing Sheets

METHOD FOR FORMING A SEMICONDUCTOR FILM BY SPUTTER DEPOSITION IN A HYDROGEN ATMOSPHERE

FIELD OF THE INVENTION

The present invention relates to a method for forming a semiconductor film of high quality by low-temperature step, for example, to fabricate a thin-film device.

BACKGROUND OF THE INVENTION

Known methods for obtaining semiconductors having one conductivity type by low-temperature steps include ion implantation and sputtering. However, ion implantation does not provides high productivity. Sputtering has the advantages that the process can be performed at low temperatures below 200° C. and that high productivity can be obtained. However, the electrical characteristics of the formed semiconductor film are so poor that this method cannot be put into practical use. For example, the electrical characteristics of a device fabricated using a semiconductor film formed by sputtering are low.

Two known methods are available to obtain a p- or n-type semiconductor film, e.g., a silicon film of one conductivity type, by the prior art sputtering. In one known method, a target consisting of a single crystal of silicon which is doped with an impurity to impact one conductivity type to the crystal is used. A sputtering process is carried out, using this target within an atmosphere consisting only of argon. In the other known method, a target consisting of a single crystal of silicon which is not doped with an impurity imparting p or n type is employed. A sputtering process is effected, using this target within an atmosphere of argon to which a reactant gas, e.g., phosphine, containing an element imparting one conductivity type is added. However, it is impossible to form a semiconductor film having one conductivity type, i.e., either p or n type, and an electrical conductivity exceeding $10^{-5}\,(\Omega.\text{cm})^{-1}$ by the prior art techniques, because the impurity imparting a conductivity type, either p or n, does not form a donor or acceptor.

SUMMARY OF THE INVENTION

It is an object of the present invention to provide a method for forming a semiconductor film of good quality by sputtering at a low temperature with high productivity.

It is another object of the invention to provide a method for forming a semiconductor film having one conductivity type and a high electrical conductivity by sputtering.

In accordance with the present invention, a semiconductor film is formed by sputtering in an atmosphere comprising a sputtering gas, e.g. hydrogen or the like. The atmosphere may comprise both hydrogen and an inert gas such as argon preferably at 30% or more of hydrogen in terms of partial pressure. The substrate is electrically insulated, i.e., placed in a floating condition. The target is placed as remotely as possible from the substrate. The substrate is placed in a floating condition because if the substrate were grounded, it would be bombarded by ions. The distance between the substrate and the target is made as large as possible for the following reason. The semiconductor film is formed by sputtering within the inert atmosphere containing a large amount of hydrogen and, therefore, the atoms of the element forming the target are emitted from the target in the form of clusters consisting of tens of atoms to hundreds of thousands of atoms. When the clusters are traveling through the hydrogen plasma, dangling bonds of the clusters are neutralized by hydrogen atoms. These clusters reach the substrate and are bonded together via hydrogen atoms. Therefore, where the ratio of the partial pressure of the hydrogen is large during the formation of the film, clusters frequently collide against hydrogen atoms in going from the target to the substrate. Consequently, the number of the dangling bonds in the silicon clusters is reduced. The bonding of the silicon clusters via hydrogen atoms becomes denser. As a result, a dense semiconductor film (in this case, a silicon film) can be obtained.

However, where the ratio of the partial pressure of the hydrogen in the inert gas such as argon is large, e.g., in excess of 80%, the deposition rate is quite low. Hence, it is impossible to make effective use of the good productivity of sputtering process. Where the ratio of the partial pressure of the hydrogen is about 30%, a practical deposition rate can be derived. Also, the formed film shows considerably satisfactory properties. This can be seen from FIG. 2 which depicts the relation between the ratio of the partial pressure of hydrogen and Raman spectra of formed intrinsic semiconductor films. We observe that where the ratio of the partial pressure is 30% or more, sharp peaks representing crystalline structure appear. We notice that peaks have shifted toward lower frequencies from the peak of 521 $\text{cm}^{-1}$ of a single crystal of silicon. These shifted peaks exhibit crystalline structure having weak lattice distortion. Calculated from the half-width values, the apparent grain sizes in diameter range from 50 Å to 500 Å, which corresponds to grain sizes of microcrystals. But in fact, the film has a semi-amorphous structure comprising a plurality of highly crystalline regions yielding a cluster structure, and the clusters are anchored to each other by the bonding between silicon atoms. The semiconductor films which produced Raman spectra shown in FIG. 2 were fabricated, using targets each consisting of a single crystal of silicon. The temperature of each substrate was 150° C. The films were created under the pressure of 0.5 Pa. The distance between the substrate and the target was 80 mm. The atmosphere consisted of a mixture of argon and hydrogen. The RF power output was 400 W. Where the ratio of the partial pressure of hydrogen during the formation of a film is 30% or more, it may be used as a semiconductor film, but if this film is used for a channel formation region in a gate-insulated field-effect transistor, it is known that the carrier mobility increases with increasing the ratio of the partial pressure ($P_H/P_{TOTAL}$) as shown in FIG. 3. The semiconductor films used for such channel formation regions in gate-insulated field-effect transistors are the silicon semiconductor films whose Raman spectra are shown in FIG. 2. In accordance with the present invention, in order to increase the probability of collision of hydrogen atoms against clusters during their travel from the target to the substrate (that is, in order to increase time taken the clusters to go from the target to the substrate for sufficiently combining dangling bonds of the clusters with hydrogen atoms), the distance between the target and the substrate is made large. That is, the distance (D) between the target and the substrate and mean free path (M) of a sputtering gas, e.g. hydrogen, satisfy expression: $D \geq 10M$ during the sputtering. As a result, a film of quality comparable with the quality obtained at a high ratio of partial pressure of hydrogen can be derived even at a low ratio of partial pressure of hydrogen such as about 30%.

In the novel method according to the present invention, the kinetic energy of clusters emitted from the target can be made small on the surface of the substrate because the probability of collision of a sputtering gas (e.g. hydrogen atoms) against the clusters is high during their travel from the target to the surface of the substrate. Therefore, sputtering of the clusters onto the substrate can be prevented. This feature is combined with the electrical floating of the substrate to provide a semiconductor film of good quality that is not damaged by bombardment of the sputtering.

In one feature of the invention, a semiconductor film having one conductivity type, i.e., either p or n type, is formed within an inert atmosphere such as argon containing hydrogen by sputtering, using a semiconductor target comprising of a single crystal or polycrystal. The ratio of the partial pressure of the hydrogen in the atmosphere is 30% or more. The target is doped with an impurity that is a group III, IV, or V element which imparts said one conductivity type. The target is doped with the impurity preferably at $1 \times 10^{17}$ atoms·cm$^{-3}$ or more.

In another feature of the invention, a film is formed by sputtering in such a manner that the temperature of the substrate is maintained below 300° C. A silicon target of a single crystal or polycrystal doped with a group III or IV or V element is used. This element is an impurity imparting one conductivity type to the target. The electrical conductivity of the target is 0.1 to 100 $(\Omega\cdot cm)^{-1}$. The sputtering process is carried out within an atmosphere containing hydrogen. The electrical conductivity of the film obtained by the sputtering is one hundredth to one third of that of the target. That is, the formed film is an n- or p-type semiconductor of an electrical conductivity of 0.1 $(\Omega\cdot cm)^{-1}$ or more. The substrate which is generally made of glass, silicon, or other material may be grounded, but it is desired to place the substrate in an electrically floating condition, i.e., it is electrically insulated from the surroundings, so that the substrate may be less affected by sputtering ions.

The sputtering process is conducted within an atmosphere having a hydrogen partial pressure ratio of 30% or more. This is based on our experimental findings. That is, the electrical conductivities of semiconductors which were formed within this atmosphere and had one conductivity type were $10^{-2}$ $(\Omega\cdot cm)^{-1}$ or more.

Where a silicon semiconductor film should be formed, the target used for the sputtering is a single crystal of silicon or polysilicon. If n type should be imparted, the target is doped with phosphorus (P), arsenic (As), or antimony (Sb). If p type should be imparted, the target is doped with boron (B) or aluminum (Al). The material of the semiconductor target is not limited to silicon. Depending on the formed semiconductor film, Ge, Se, or a compound semiconductor such as gallium arsenide or gallium antimonide can be used.

The formed semiconductor film having one conductivity type can be thermally annealed at a temperature of 700° C. or lower.

The novel method is characterized in that high electrical conductivities exceeding $10^{-2}$ $(\Omega\cdot cm)^{-1}$ which would have been heretofore obtained by annealing a one-conductivity type semiconductor film fabricated by sputtering or CVD can be achieved by sputtering at low temperatures below 150° C. This can be seen from the Raman spectra (see FIG. 2) of the n-type semiconductor films obtained immediately after the formation of the films, i.e., the films were not yet annealed. In particular, the Raman spectra of the n-type semiconductor film formed by sputtering within an atmosphere whose ratio of hydrogen partial pressure was 50% had a peak showing crystalline structure at wavenumber lower than the peak of 521 cm$^{-1}$ of a single crystal of silicon.

Of course, the novel method can be used to fabricate semiconductors other than silicon semiconductor. For example, a semiconductor film having one conductivity type and a composition given by $Si_xGe_{1-x}$ ($0 \leq X \leq 1$) can be obtained by using a target of silicon and a target of germanium simultaneously. The targets are doped with an impurity imparting one conductivity type, such as a group III or V element (e.g., boron or phosphorus) in the Periodic Table. In this case, the composition of the semiconductor film can be varied by varying the areas of the two targets. On this principle, a semiconductor film having a more complex composition can be formed by using more targets simultaneously.

Other objects and features of the invention will appear in the course of the description thereof which follows.

DETAILED DESCRIPTION OF THE INVENTION

Figure 1:
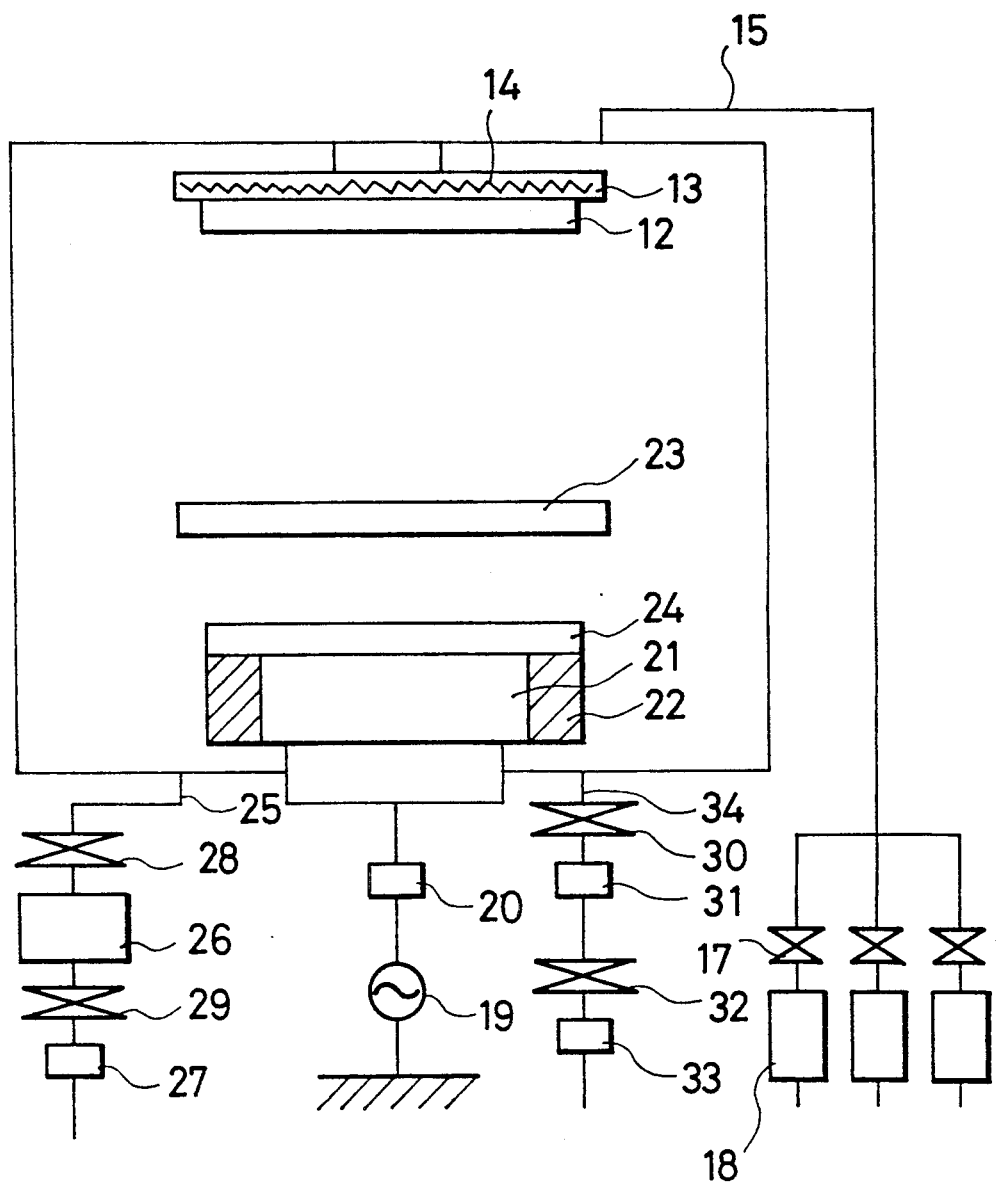
FIG. 1 is a schematic cross-sectional view of a sputtering apparatus for carrying out a method according to the invention.

Referring to FIG. 1, there is shown an RF sputtering apparatus comprising a magnetron 21 for forming for example an n-type silicon semiconductor film on a 1000 Å thick silicon oxide film provided on a glass substrate 12 by a method according to the invention. A holder 13 which can be rotated if necessary is in an electrically floating condition. A heater 14 acts to heat the substrate. A gas inlet line 15 is equipped with valves 17. Bombs 18 are filled with hydrogen to supply hydrogen gas. Although only one gas supply system is shown in FIG. 1, a system for supplying other gas such as argon, phosphine, diborane, nitrogen, or other gas may be provided if necessary. A plurality of gas inlet systems can be provided to supply plural gases into the reaction chamber simultaneously. An RF power supply 19 of 13.56 MHz is connected with the magnetron 21 via an RF matching device 20. The magnetron 21 has a permanent magnet 22 on a circumference. The magnet 22 can be rotated as the need arises.

A shutter 23 is located in front of the substrate 12 to prevent sputtering particles such as atoms, clusters, and ions, from reaching the substrate 12. Specifically, the shutter 23 serves to prevent impurities from being sputtered onto the substrate immediately after the start of the sputtering process. If necessary, the sputtering particles are prevented from reaching the formed surface by the shutter 23. A target 24 may be doped with an impurity, e.g. phosphorus, boron, fluorine, or other halogen element if necessary. A gas exhaust system 25 is connected with the reaction chamber and has a turbomolecular pump 26, an oil rotary pump 27, valves 28 and 29. The reaction chamber is also connected with a second exhaust system 34 having a cryogenic pump 31 and a rotary pump 33 for attaining a higher degree of vacuum or for discharging certain impurities. The second exhaust system 34 has valves 30 and 32.

The second exhaust system 34 equipped with the cryogenic pump 31 is used principally to achieve a high vacuum prior to the formation of a film. The second exhaust system 34 can evacuate the inside of the reaction chamber to about $10^{-10}$ torr and can discharge gases and molecules adsorbed on the inner surface of the reaction chamber. The evacuation to a high vacuum prior to the formation of a film is especially effective in reducing the amount of impurities contained in the film such as oxygen, carbon, and nitrogen.

In the present embodiment, the substrate 12 is heated by the heater 14. Instead, the substrate can be heated by an infrared lamp.

In the present embodiment, the target consists of molten silicon doped with antimony which is an impurity imparting one conductivity type to the silicon. The resistivity p of the target is 0.60 $\Omega \cdot$cm. Of course, an impurity imparting the other conductivity type can be implanted into the silicon. Where the imparted conductivity type is n, the impurity can be As or Sb. Where the imparted conductivity type is p, the impurity can be B. Making the electrical conductivity of the target high by annealing or other method is advantageous. The film was formed within an atmosphere of a mixture of hydrogen and argon. The partial pressure of the hydrogen was taken as a parameter. The film formation temperature was 150° C. The pressure was 0.5 Pa. The RF electric power was 400 W. The distance between the substrate and the target was 100 mm. The substrate was placed in an electrically floating condition. The silicon semiconductor film was formed to a thickness of 2000 Å on the glass substrate.

Figure 4:
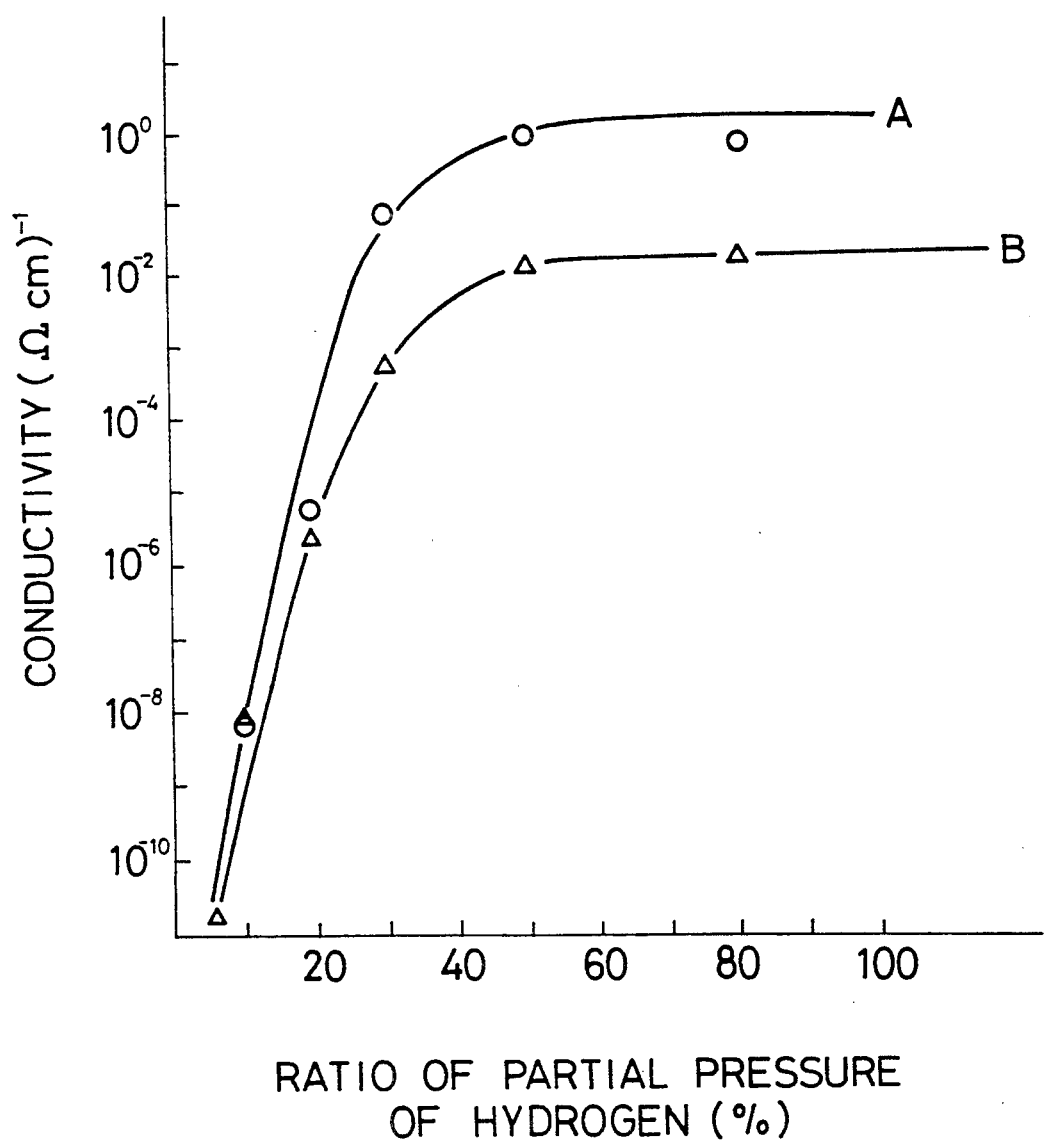
FIG. 4 is a graph in which the electrical conductivities of the semiconductor films formed, using the apparatus shown in FIG. 1 are plotted against the ratio of the partial pressure of the hydrogen contained in the atmosphere within which the semiconductor films were formed.

Curve A of FIG. 4 shows the relation of the electrical conductivity $(\Omega \cdot$cm$)^{-1}$ of an n-type semiconductor film formed by the method of this embodiment to the percentage of the partial pressure of hydrogen contained in the atmosphere when the film was formed. It can be seen from this curve that the electrical conductivity of $10^{-2}$ $(\Omega \cdot$cm$)^{-1}$ or more is obtained when the percentage of the partial pressure of hydrogen is 30% or more during the sputtering. This curve shows that the partial pressure of hydrogen should be made as high as possible.

Figure 5:
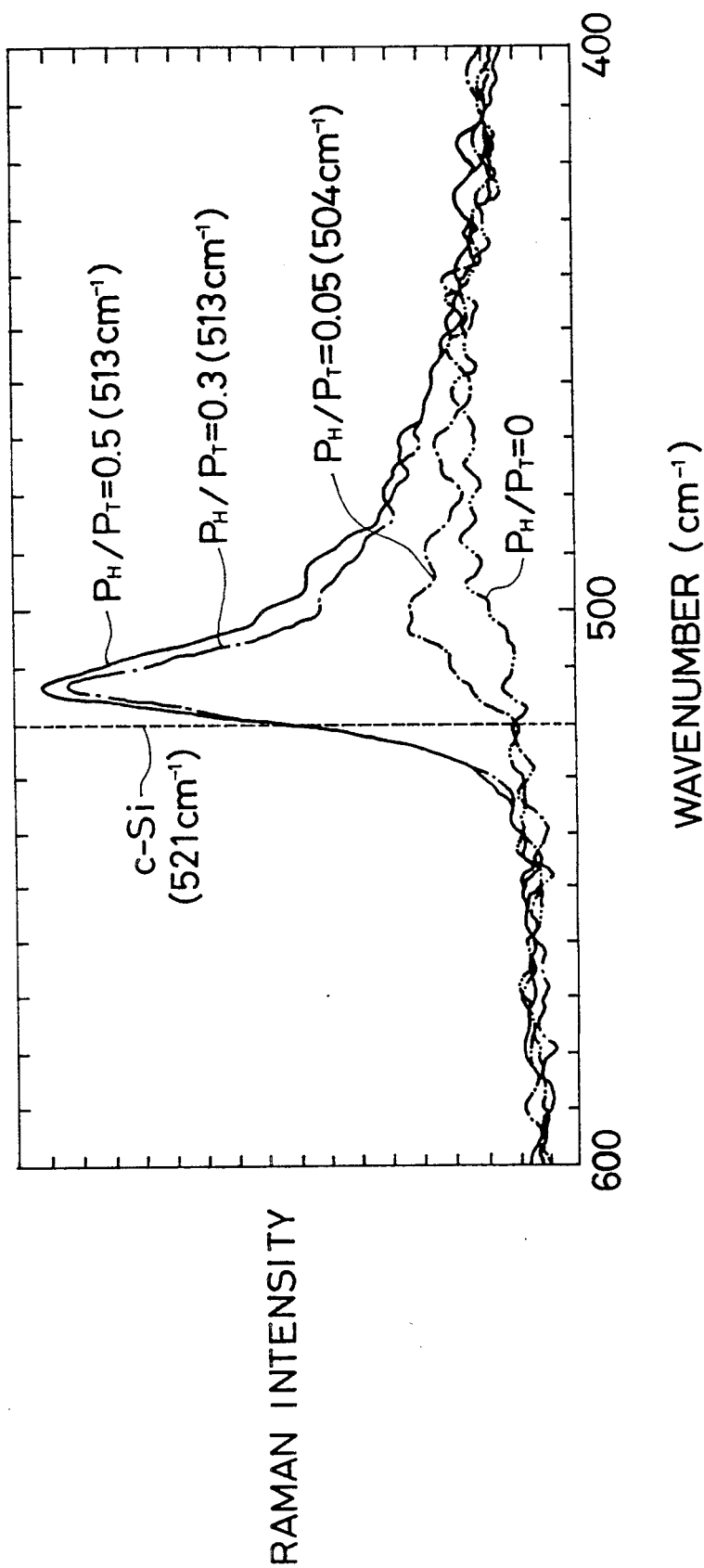
FIG. 5 is a graph showing Raman spectra obtained from the semiconductor films formed, using the apparatus shown in FIG. 1.

FIG. 5 shows Raman spectra of films formed by the method of this embodiment for different ratios of partial pressure of hydrogen. It can be seen from these spectra that sharp peaks appear at wavenumbers lower than the peak of 521 cm$^{-1}$ of a single crystal of silicon at ratios of partial pressure of hydrogen ($P_H/P_T$) of 30% or more. In this way, the present invention is characterized in that semiconductor films showing high crystalline properties as shown in FIG. 5 can be obtained at a low temperature of the substrate of 150° C.

Generally, where the electrical conductivity is excess of $10^{-1}$ $(\Omega \cdot$cm$)^{-1}$, the formed films can be sufficiently practically used as the source and drain regions of a gate-insulated field-effect transistor. Hence, a silicon film having a large area and one conductivity type (in this case, n-type silicon film) can be formed by sputtering within an inert atmosphere containing hydrogen. In this manner, the novel method is economically more advantageous than the prior art impurity ion doping. Also, the formed semiconductor films having one conductivity type are excellent in electrical characteristics.

The concentration of the oxygen contained in the film formed by the novel method is preferably $7 \times 10^{19}$ atoms$\cdot$cm$^{-3}$ or less, more preferably $1 \times 10^{19}$ atoms$\cdot$cm$^{-3}$ or less. Concentrations of impurities were measured by secondary ion mass spectrometry. The concentration of oxygen was $8 \times 10^{18}$ atoms$\cdot$cm$^{-3}$ and the concentration of carbon was $3 \times 10^{16}$ atoms$\cdot$cm$^{-3}$ in the measurement. The concentration of hydrogen was $4 \times 10^{20}$ atoms$\cdot$cm$^{-3}$, which accounted for 1 atomic % of the amount of silicon of $4 \times 10^{22}$ atoms$\cdot$cm$^{-3}$.

The electrical conductivities of the films formed by the sputtering are one hundredth to one third of the electrical conductivity of the target. That is, p- or n-type semiconductors having electrical conductivities of 0.1 $(\Omega \cdot$cm$)^{-1}$ or more can be obtained. This is advantageous.

In order that the substrate may be less affected by sputtering ions, the substrate which is generally made of glass or silicon is placed in an electrically floating condition. In the present embodiment, the substrate holder 13 is placed in a floating condition. Where the substrate, or the substrate holder 13, was grounded, the formed semiconductor film was sputtered by ions. As a result, the XRD intensity varied greatly among samples. Also, the device using this semiconductor film showed quite poor reproducibility.

Where the distance between the substrate and the target of the present embodiment was halved, only low electrical conductivities as indicated by curve B in FIG. 4 were obtained.

More specifically, where a semiconductor film is formed by sputtering within an inert atmosphere containing hydrogen in accordance with the present invention, if it is desired to obtain such film quality at a low partial pressure of hydrogen that is comparable with that obtained at a high partial pressure of hydrogen, then the distance between the substrate and the target is set larger than the distance used in the process making use of the high partial pressure of hydrogen. That is, the distance (D) between the target and the substrate and mean free path (M) of a sputtering gas, e.g. hydrogen, satisfy expression: $D \geq 10M$ during the sputtering.

In the present embodiment, an n-type silicon semiconductor film was formed on a substrate, using a target doped with antimony. Where the target is doped with an impurity imparting the n conductivity type, the target can consist of a single crystal of silicon or polysilicon doped with a group V element such as phosphorus, arsenic, or antimony. Where the target is doped with an impurity imparting the p conductivity type, the target can consist of a single crystal of silicon or polysilicon doped with a group III element such as boron or aluminum. The material of the single crystal of the target or the material of the polycrystalline target is not limited to silicon. Depending on the formed semiconductor film, Ge, Se, or a compound semiconductor such as gallium arsenide or gallium antimonide can be used.

The formed semiconductor film having one conductivity type can be thermally annealed at a temperature of 700° C. or lower.

The novel method according to the present invention is characterized in that high electrical conductivities of $10^{-2}(\Omega \cdot cm)^{-1}$ or more which would have been heretofore obtained by annealing a one-conductivity type semiconductor film fabricated by sputtering or CVD can be achieved by sputtering at low temperatures below 150° C. This can be seen from the Raman spectra (FIG. 5) of the n-type semiconductor films (of the present invention) obtained immediately after the formation of the film, i.e., the films were not yet annealed. In particular, the Raman spectra of the n-type semiconductor films (of the present invention) formed by sputtering within an atmosphere whose ratio of hydrogen partial pressure was 50% had a peak showing crystalline properties at a wavenumber lower than the peak of 521 $cm^{-1}$ of a single crystal of silicon.

In the present embodiment, certain impurities such as oxygen, carbon, and nitrogen are selectively expelled by the use of the cryogenic pump mounted in the exhaust system 34 connected with the RF sputtering apparatus (FIG. 1) comprising the magnetron. This is very effective in improving the quality of the semiconductor film formed by sputtering. For example, if impurities such as oxygen, carbon, and nitrogen other than impurities behaving as acceptors or donors exist within the p- or n-type semiconductor film doped with an impurity imparting one conductivity type, then the performance of a device fabricated using this semiconductor film will be adversely affected by those impurities. For instance, if oxygen element enters a semiconductor layer forming a solar cell, the conversion efficiency or the durability may be deteriorated. Therefore, oxygen, carbon, nitrogen, and other impurities are expelled efficiently to prevent the semiconductor film from being adversely affected.

In the present embodiment, molecules of oxygen, carbon, nitrogen, and other impurities can be efficiently driven out through the use of the cryogenic pump mounted in the sputtering apparatus shown in FIG. 1. The cryogenic pump is an adsorption pump. As an example, when a film was formed using only the first exhaust system 25 having the turbo-molecular pump, analysis by secondary ion mass spectrometry revealed that the concentration of the oxygen contained in the formed film was approximately $3 \times 10^{19}$ atoms·$cm^{-3}$. On the other hand, the concentration of the oxygen contained in the film formed using the second exhaust system 34 together with the first exhaust system at the same film formation pressure was $6 \times 10^{18}$ atoms·$cm^{-3}$. The concentration of the carbon contained in the formed film was $3 \times 10^{16}$ atoms·$cm^{-3}$. The concentration of hydrogen was $4 \times 10^{20}$ atoms·$cm^{-3}$, which is 1 atomic % of the amount of silicon of $4 \times 10^{22}$ atoms·$cm^{-3}$.

Figure 6:
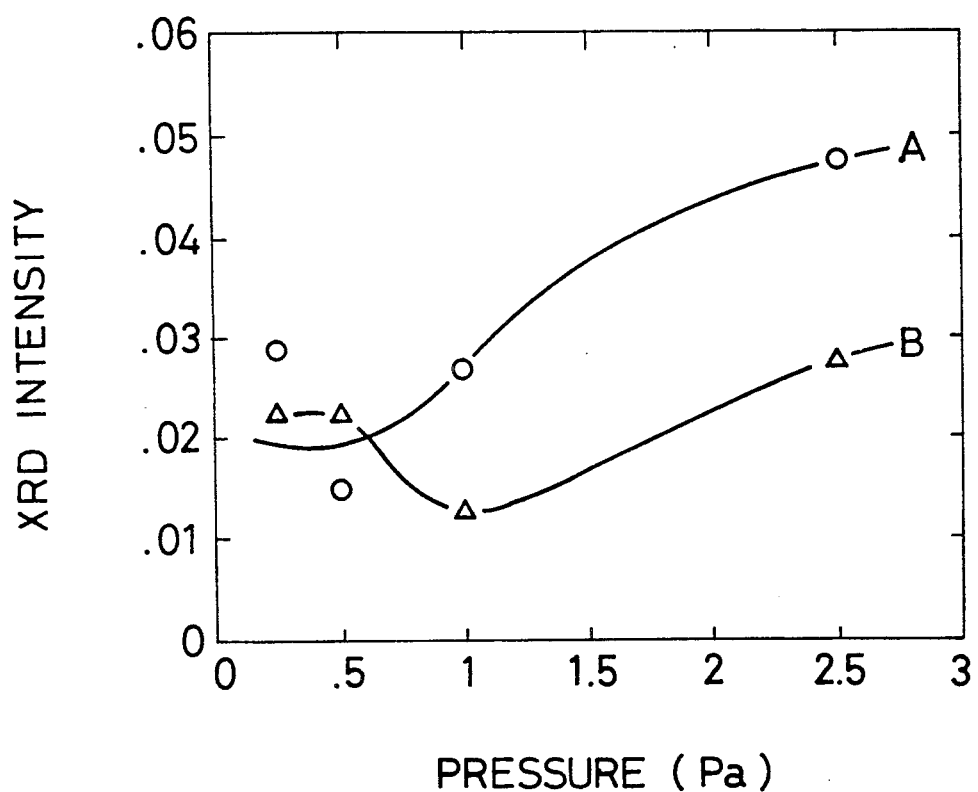
FIG. 6 is a graph in which the intensity of XRD is plotted against the pressure at which the semiconductor films were formed, using the apparatus shown in FIG. 1.

It can be seen from FIG. 6 that relatively high pressures of about 2.5 Pa can yield good films. Processes in ultrahigh vacuum are not appropriate. Hence, as described already, the use of the cryogenic pump capable of expelling oxygen, carbon, and nitrogen as adsorbed molecules yields great advantages. In the novel method, a film is formed by sputtering within an atmosphere of a mixture of an inert gas such as argon and hydrogen. Therefore, oxygen atoms which are the most annoying kind of impurity are bonded to hydrogen atoms to thereby form molecules existing in the reaction chamber. Consequently, these molecules composed of oxygen and hydrogen can be expelled efficiently by the use of the cryogenic pump as described above. Where a semiconductor film that must contain an impurity, e.g., phosphorus or antimony, contributing to the conductivity type, or either p or n, is formed as in the novel method, if vapor phase epitaxy such as CVD using a reactive gas is employed, an impurity contributing to the conductivity type must be added to the vapor phase. Therefore, intrusion of unwanted impurities is inevitable. This problem can be solved by using a reactive gas of a quite high purity and a special reaction furnace, but this system is costly to achieve. In addition, the productivity is low.

As described thus far, in the present embodiment, the turbo-molecular pump and the cryogenic pump are used simultaneously to form a semiconductor film, especially a semiconductor film containing a group III or V element imparting one conductivity type, by sputtering within an inert atmosphere containing hydrogen and no reactive gas. In this method, unwanted impurities existing in the formed semiconductor film such as oxygen, carbon, and nitrogen can be efficiently expelled. In addition, this method can form such a film quite economically and with high productivity.

The formed n-type semiconductor film can be thermally annealed at a temperature of 700° C. or lower.

In the novel method, the used target consists of a single crystal of a semiconductor or a polycrystalline semiconductor. The group III or V element which is used to impart p or n conductivity type to the target is fully ionized. That is, the impurity of the group III or V element has been completely changed into an acceptor or donor. This target is subjected to sputtering within the atmosphere containing hydrogen. Clusters in which the impurity atoms form an acceptor or donor travel toward and reach the substrate while the dangling bonds are neutralized by the hydrogen plasma. Therefore, the impurity atoms of the group III or V element are ionized at a high rate in the semiconductor film formed by sputtering. These impurity ions are changed into an acceptor or donor, and the rate of ionization can be enhanced.

Of course, the novel method can be used to fabricate semiconductors other than silicon semiconductor. For example, a semiconductor film having one conductivity type and a composition given by $Si_XGe_{1-X} (0 \leq X \leq 1)$ can be obtained by using a target of silicon and a target of germanium simultaneously. The targets are doped with an impurity imparting one conductivity type. In this case, the composition of the semiconductor film can be varied by varying the areas of the two targets. On this principle, a semiconductor film having a more complex composition can be formed by using more targets simultaneously.

It is also possible to add a halogen element to the atmosphere of the sputtering process. About 0.1 to 10% $NF_3$ or other compound may be added to neutralize dangling bonds in clusters of sputtering atoms.

A second embodiment of the novel method forming a p-type semiconductor film having a composition given by $Si_xGe_{1-x}$ is now described. The RF sputtering apparatus shown in FIG. 1 and having the magnetron was used. The semiconductor film was doped with boron. The pressure was 2.5 Pa. The RF power was 200 W. The temperature of the substrate was 100° C. The sputtering process was carried out within an atmosphere of a mixture of hydrogen and argon. The ratio of the partial pressure of the hydrogen was 80%. In this case, mean free path of argon is about 3 mm and mean free path of hydrogen ($H_2$) is about 6 mm. Therefore, a semiconductor film having an excellent quality can be formed with a distance between the substrate and the target equal to or more than 60 mm. (This 60 mm is ten times as long as one of the mean free path of argon (about 3 mm) and the mean free path of hydrogen (about 6 mm) longer than the other.) The distance between the substrate and the target was 90 mm in the present embodiment. Then, the film was annealed for 72 hours at 600° C. to obtain an n-type semiconductor film having a composition given by $Si_xGe_{1-x}$. To improve the homogeneity of the n-type $Si_xGe_{1-x}$ semiconductor film formed on the substrate, a plurality of molten substrates having the same area and containing phosphorus of a concentration of $1 \times 10^{17}$ atoms·cm$^{-3}$ or more were distributed opposite to the target of a single crystal of silicon or germanium. The substrates were rotated.

Also in the present embodiment, the boron atoms in the target of a single crystal of silicon or germanium form acceptor atoms. Consequently, a p-type semiconductor having an electrical conductivity that is one hundredth to one third of that of the target can be formed. This is one feature of the present invention.

The pressure at which the reaction was performed was set to a high value of 2.5 Pa, based on our experimental findings indicated by curve A in FIG. 6. FIG. 6 shows the relation between the pressure during deposition of the n-type silicon semiconductor film and the industry of XRD of a film obtained by annealing the n-type silicon semiconductor film for 72 hours at 600° C. The target consisting of a single crystal of silicon or polysilicon was doped with phosphorus such that the resistivity of the target was 2 to 3 kΩ·cm. The film was formed at 150° C. The RF power was 400 W. The atmosphere consisted of a mixture of hydrogen and argon. The ratio of the partial pressure of the hydrogen ($P_H/P_T$) was 30%. The distance between the substrate and the target was 120 mm.

After the formation of the film, it was annealed for 72 hours at 600° C. within an insert atmosphere. It can be seen from curve A of FIG. 6 that high crystallinity was obtained at a pressure of about 2.5 Pa. In this case, mean free path of argon is about 3.5 mm and mean free path of hydrogen ($H_2$) is about 7 mm. Therefore, such high crystallinity can be obtained with the distance equal to or more than 70 mm. (This 70 mm is ten times as long as one of the mean free path of argon (about 3.5 mm) and the mean free path of hydrogen (about 7 mm) longer than the other.) However, where the distance between the substrate and the target was set to 60 mm, the crystallinity of the formed films was low as indicated by curve B of FIG. 6. This is because clusters consisting of atoms forming the target reached the substrate and formed a coating and, at the same time, the clusters sputtered the semiconductor film on the substrate. That is, the clusters which had to form the semiconductor film were damaged. Hence, the quality of the formed film was adversely affected.

Figure 7:
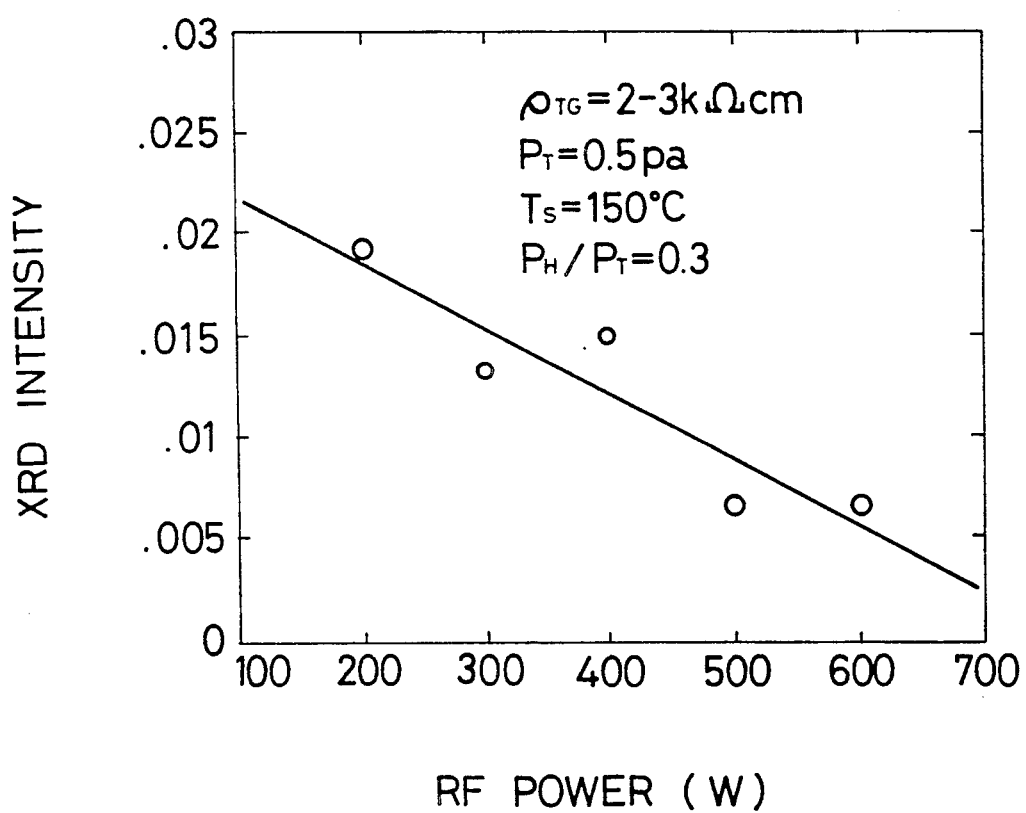
FIG. 7 is a graph in which the intensity of XRD is plotted against the electric power supplied to form the semiconductor films, using the apparatus shown in FIG. 1.

The RF power was set to 200 W, based on the experimental results shown in FIG. 7. FIG. 7 shows the relation of the intensity of XRD to the electrical power supplied when the films were formed at a pressure of 0.5 Pa. The other conditions were the same as those described in connection with FIG. 6. It can be seen from FIG. 7 that semiconductor films formed at relatively low electrical power of about 200 W showed high crystallinity. These results also show that the substrate is sputtered and the formed film is adversely affected at higher electric power supplied.

Figure 8:
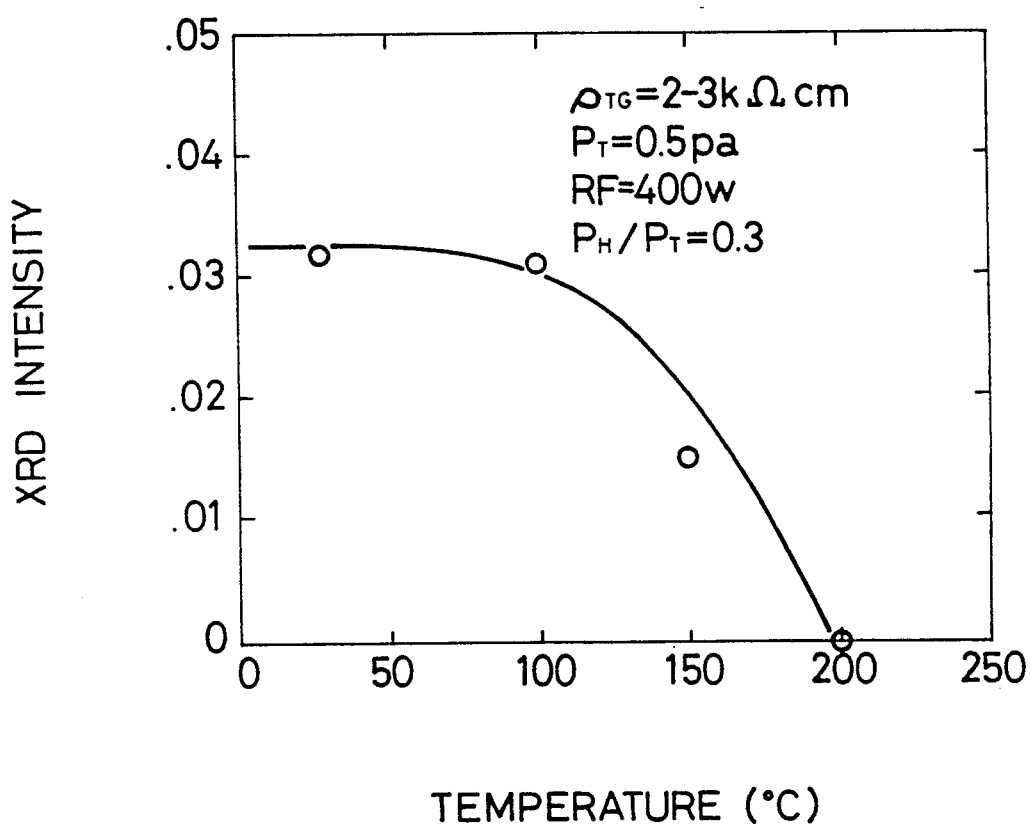
FIG. 8 is a graph in which the intensity of XRD is plotted against the temperatures of the substrates on which the semiconductor films were formed, using the apparatus shown in FIG. 1.

In the present embodiment, the temperature of the substrate was set to 100° C., based on our experimental findings shown in FIG. 8. That is, where a film is formed while the temperature of the substrate is retained below 200° C., high film quality can be obtained. FIG. 8 shows the relation of the intensity of XRD to the temperature of the substrate when films were formed under the same conditions as the films described in connection with curve A of FIG. 6. We observe that the crystallinity of the annealed films was low where the temperature of the substrate was above 200° C. and that the crystallinity of the annealed films was high where the temperature of the substrate was 200° C. or lower. The tendency shown in FIG. 8 can be explained away by a model described below.

A silicon film formed by sputtering in the present embodiment undergoes a sputtering operation within an atmosphere containing a large amount of hydrogen. Therefore, the atoms forming the target are ejected from it as clusters consisting of tens of atoms to hundreds of thousands of atoms. While the clusters are traveling through the hydrogen plasma, the dangling bonds of the clusters are neutralized by hydrogen atoms and then the clusters reach the substrate. At this time, the impurity which imparts p or n conductivity type to the target acts as an acceptor or donor in the target and so impurity atoms contained in the clusters traveling toward the substrate also act as the acceptor or donor. For this reason, after the clusters have reached the substrate and formed a silicon film, the impurity imparting p or n conductivity type acts as an acceptor or donor in the film formed by the sputtering.

Figure 2:
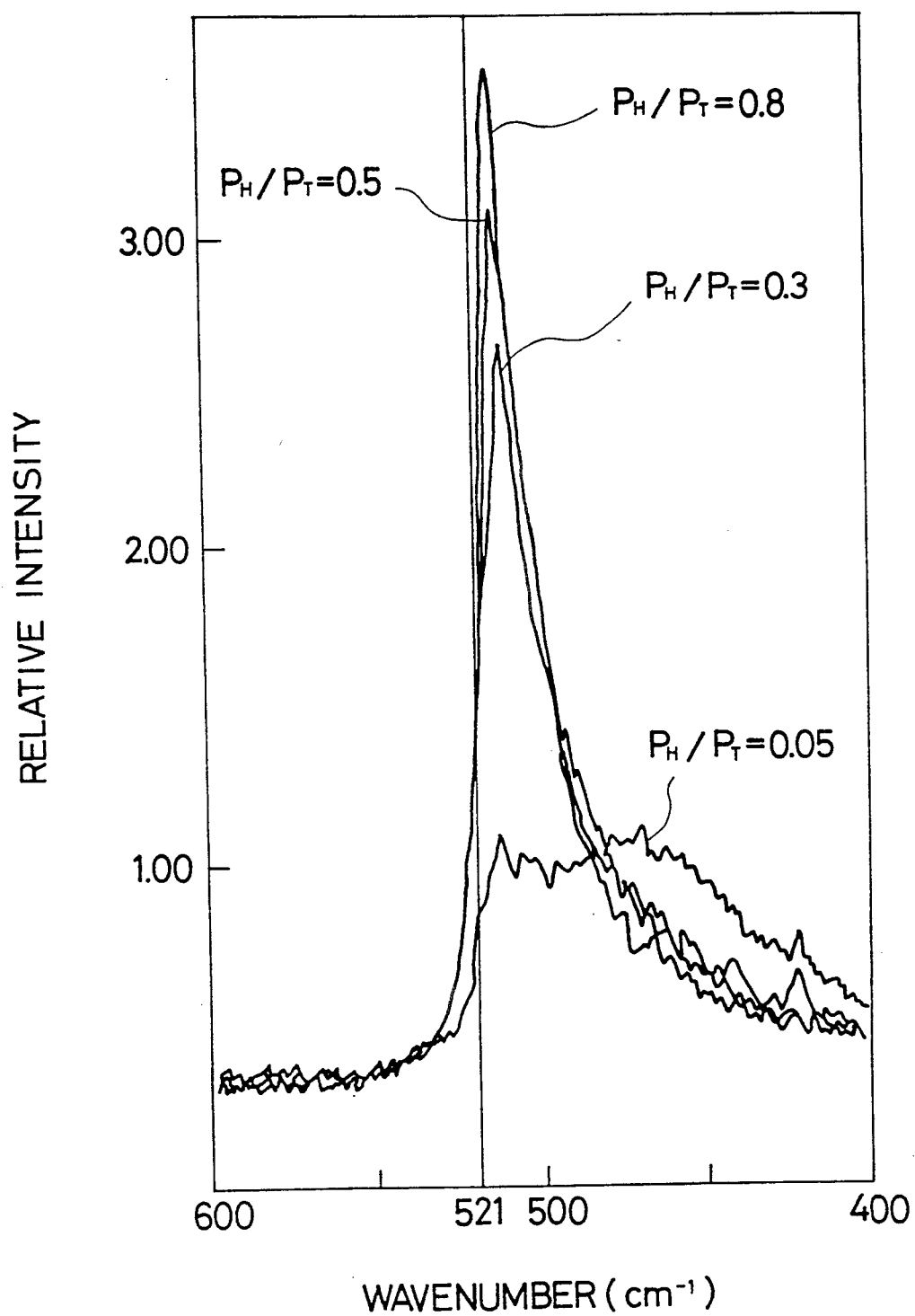
FIG. 2 is a graph showing Raman spectra obtained from semiconductor films formed, using the apparatus shown in FIG. 1.
Figure 3:
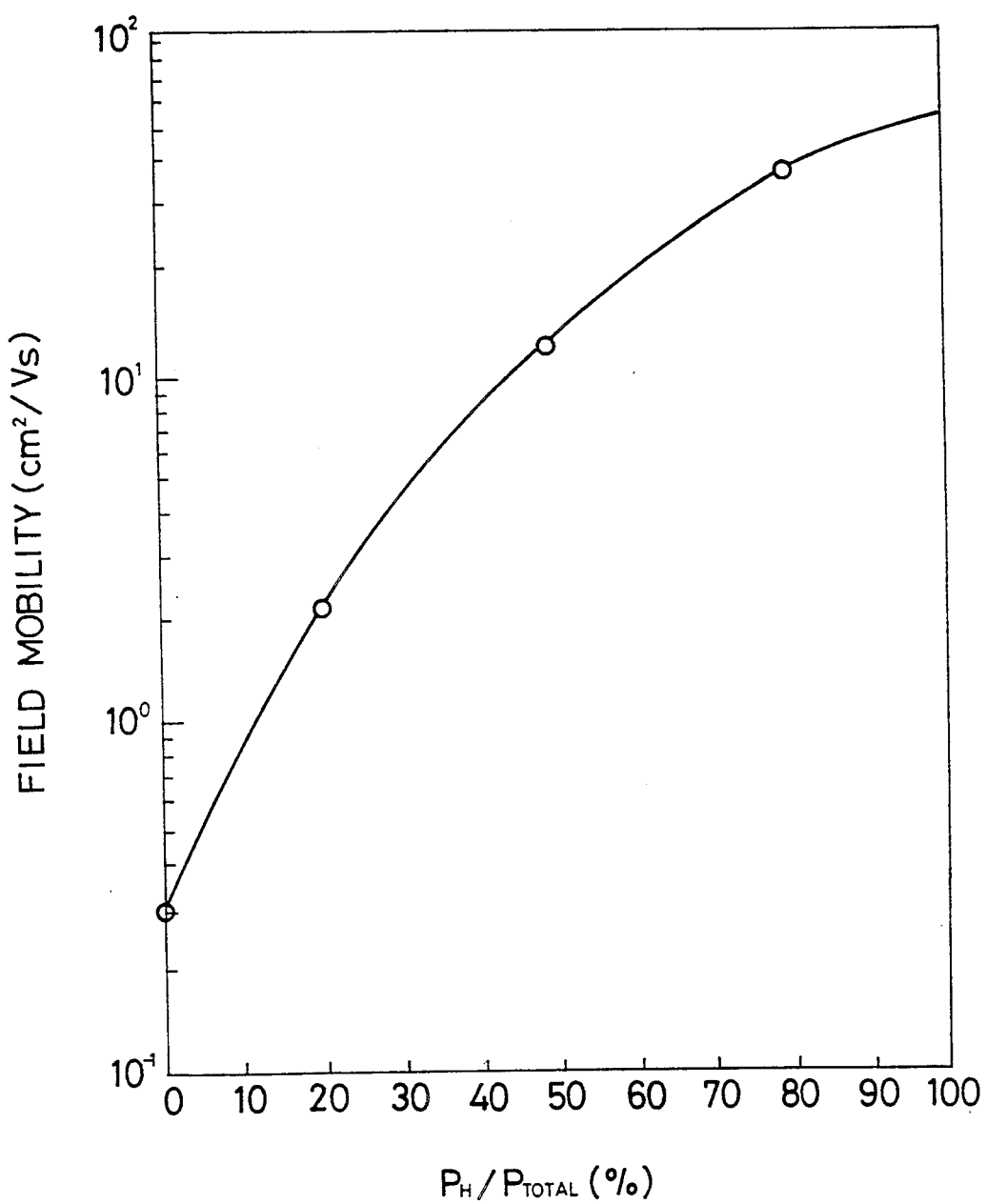
FIG. 3 is a graph in which the mobilities ($\mu$) of gate-insulated field-effect transistors using semiconductor films formed, using the apparatus shown in FIG. 1 are plotted against the ratio of the partial pressure of the hydrogen contained in the atmosphere within which the semiconductor films were formed.

When clusters whose dangling bonds have been neutralized by hydrogen atoms go to the substrate from the target, if the temperature is high during the formulation of the film, then the hydrogen atoms neutralizing the dangling bonds leave, so that the clusters cannot be bonded together on the substrate. In this way, an ordered structure is not formed. Accordingly, where a silicon film formed within an atmosphere above 200° C. is annealed, the film cannot shift into a more highly ordered state. As a result, the intensity of XRD is low. On the other hand, where a film is formed at a low temperature, the clusters of silicon which form sputtering particles are bonded together via hydrogen atoms on the substrate. The result is that a relatively highly ordered state is realized. This film is annealed at a temperature of 450°–700° C., so that the silicon clusters bonded together via hydrogen atoms are bonded together directly. In consequence, they make a transition into a more highly ordered state. Since the existing silicon atoms are bonded together, they pull each other. Measurement by laser Raman spectrometry has shown that peaks shifted toward lower frequencies from the peak of 521 cm$^{-1}$ of a single crystal of silicon as shown in FIG. 2. These shifted peaks represent crystalline structures having weak lattice distortion. Calculated from the half-width values, the apparent grain sizes in diameter range from 50 Å to 500 Å, which correspond to grain sizes of microcrystals. But in fact, the film has a semi-amorphous structure comprising a plurality of highly crystalline regions yielding a cluster structure, and the clusters are anchored to each other by the bonding between silicon atoms. The regularity of a silicon film formed by sputtering at a low temperature below 150° C. is promoted by annealing. In contrast, a film formed by sputtering at a high temperature has no regularity from the beginning as mentioned above. If it is annealed, it is not possible to form a film of semi-amorphous structure in which the clusters are anchored together by silicon atoms. Also, almost no XRD peaks appear.

Thus, we can conclude that where a semiconductor film, for example a semiconductor film having one conductivity type, is formed by sputtering within an inert atmosphere containing hydrogen by the use of a target for example doped with an impurity imparting the conductivity type to the target, the temperature of the substrate should be maintained below 200° C., preferably below 150° C., for the following reason.

As described previously, where a film is formed at a low temperature, the clusters of silicon sputtered are bonded together via hydrogen atoms. Subsequent annealing causes the silicon clusters to be bonded together. Consequently, the crystalline structure is preserved or promoted in spite of the annealing.

Also in the present embodiment, the electrical conductivity of the film formed by sputtering can be increased by increasing the electrical conductivity of the target. Specifically, the impurity forming an acceptor or donor in the target exists at a high ionization rate within the film formed by sputtering within an atmosphere containing hydrogen. The impurity is transformed into an acceptor or donor. In this way, it is possible to obtain a p- or n-type semiconductor film having a high electrical conductivity that is one hundredth to one third of that of the target.

A third embodiment of the novel method is now described. An n-type semiconductor film having a composition given by $Si_xC_{1-x}$ ($0 \leq X \leq 1$) and doped with phosphorus was formed under the same conditions as in the second embodiment. In the present embodiment, numerous targets of silicon and carbon are distributed. The stoichiometric ratio can be varied by changing the ratios of the silicon and carbon. In this case, either the targets or the substrate was rotated to increase the homogeneity of the formed film.

In the illustrated embodiments, targets doped with an element which imparts one conductivity type to a semiconductor such as antimony, phosphorus, or boron are used. Of course, an undoped intrinsic semiconductor film of Si, Ge, $Si_xGe_{1-x}$ or $Si_xC_{1-x}$ ($0 \leq X \leq 1$) can be formed, using an undoped target of Si, Ge, $Si_xGe_{1-x}$, or $Si_xC_{1-x}$ ($0 \leq X \leq 1$).

As described in detail thus far, by the novel method, a semiconductor film having one conductivity type and a high electrical conductivity can be formed by performing a sputtering operation over a substrate below 200° C., using a semiconductor target doped with an impurity imparting one conductivity type to the target, within an inert atmosphere containing hydrogen, the ratio of the partial pressure of the hydrogen being 30% or more.

The foregoing description of preferred embodiments has been presented for purposes of illustration and description. It is not intended to be exhaustive or to limit the invention to the precise form described, and obviously many modifications and variations are possible in light of the above teaching. The embodiments were chosen in order to explain most clearly the principles of the invention and its practical application thereby to enable others in the art to utilize most effectively the invention in various embodiments and with various modifications as are suited to the particular use contemplated. An example of such modifications is as follows.

In the foregoing embodiment, argon is used as an inert gas, however, helium, neon, krypton, or xenon can be also used as an inert gas of the sputtering atmosphere in the present invention.

What is claimed is:

1. A method for forming a semiconductor film comprising:
   sputtering in an atmosphere comprising hydrogen and an inert gas at a hydrogen partial pressure of 30% or more in a chamber a semiconductor target;
   forming a semiconductor film on a substrate by said sputtering; and
   maintaining said substrate in an electrically floating state during said sputtering.

2. The method of claim 1 wherein said semiconductor target comprises a semiconductor selected form the group consisting of Si, Ge, Se, gallium arsenide, $Si_xGe_{1-x}$ and $Si_xC_{1-x}$ where $0 \leq X \leq 1$.

3. The method of claim 1 wherein said impurity is an element selected from Group III and Group V in the Periodic Table.

4. The method of claim 1 wherein said semiconductor target comprises a single crystalline or polycrystalline semiconductor.

5. The method of claim 1 wherein said substrate is maintained at a temperature of 200° C. or lower during said sputtering.

6. The method of claim 1 further comprising the step of thermally annealing said semiconductor film of said one conductivity type at a temperature of 700° C. or lower.

7. The method of claim 1 wherein said atmosphere comprises a halogen element together with hydrogen.

8. A method for forming a semiconductor film on a substrate provided in a chamber comprising the step of:
   sputtering a target in an atmosphere comprising a sputtering gas including hydrogen and an inert gas at a hydrogen partial pressure of 30% or more in said chamber with said substrate electrically floating,
   wherein distance (D) between said substrate and said target and mean free path (M) of the sputtering gas satisfy equation: $D \geq 10M$ during said sputtering step.

9. The method of claim 8 wherein said mean free path is mean free path of said hydrogen.

10. The method of claim 8 wherein said mean free path is mean free path of one of said hydrogen and said inert gas longer than that of the other.

11. The method of claim 8 wherein said atmosphere comprises a halogen element.

12. The method of claim 8 wherein said target comprises a semiconductor selected from the group consisting of Si, Ge, Se, gallium arsenide, $Si_xGe_{1-x}$ and $Si_xC_{1-x}$ where $0 \leq X \leq 1$.

13. The method of claim 8 wherein said target comprises a single crystalline or polycrystalline semiconductor.

14. The method of claim 8 wherein said substrate is maintained at a temperature of 200° C. or lower during said sputtering.

15. The method of claim 8 wherein said inert gas comprises argon.

* * * * *